United States Patent [19]
White

[11] Patent Number: 5,675,498
[45] Date of Patent: Oct. 7, 1997

[54] MEASURING AMPLITUDE OF SPARSELY SAMPLED SINUSOIDAL SIGNAL

[75] Inventor: Stanley A. White, San Clemente, Calif.

[73] Assignee: Boeing North American, Inc., Seal Beach, Calif.

[21] Appl. No.: 636,088

[22] Filed: Apr. 22, 1996

[51] Int. Cl.$^6$ .......................... G01R 25/04; G01R 27/02; H04L 27/14
[52] U.S. Cl. .......................... 364/487; 364/484; 364/572; 375/346; 375/340; 375/344
[58] Field of Search ..................... 364/487, 484, 364/481, 480, 572, 724.01, 724.19; 375/281, 304, 305, 324, 316, 326, 344–346, 350

[56] References Cited

U.S. PATENT DOCUMENTS 4,495,643  1/1985  Orban ........................................ 381/94

Primary Examiner—James P. Trammell
Assistant Examiner—Demetra R. Smith
Attorney, Agent, or Firm—Tom Streeter; Charles T. Silberberg

[57] ABSTRACT

Sparse sampling of an analog signal is desirable because it allows a large number of analog signals to be monitored using a minimum of electronics. The analog signals may be multiplexed and the multiplexed signal applied to a single analog-to-digital converter (ADC) driving a single digital processor. However, such sparse sampling undesirably lengthens the time it takes to get an accurate measurement of the signal. This delay is minimized by Hilbert transforming the digitized signal 16 to produce an in-phase signal I and a quadrature-phase signal Q, and by measuring $I^2+Q^2$. $I^2+Q^2$ is the square of the amplitude of the input signal. The input signal 12 is sampled at about four times the signal's frequency. DC bias is eliminated in a two-delay delay-subtracter dc blocker, 18B. The de-blocked signal 20 is applied to a two-delay Hilbert transformer 22. Only five samples are required to accurately measure the amplitude of the input signal 12. This is only two samples more than the theoretical minimum.

8 Claims, 4 Drawing Sheets

MEASURING AMPLITUDE OF SPARSELY SAMPLED SINUSOIDAL SIGNAL

BACKGROUND OF THE INVENTION

This invention relates generally to measuring signals, and more specifically to measuring the amplitude of a sinusoidal analog signal which has been digitally sampled at a frequency not much greater than double the frequency of the signal itself. It has particular relation to measuring the amplitude of such signals when the frequency is known but the phase and dc bias are not known.

Electronically driven tuning forks are becoming important in inertial navigation. Applicant has disclosed a variety of inventions related to a digital quartz inertial measurement unit (DQI) in the U.S. Patents shown in the following table:

| U.S. Pat. No. | Title | Issue Date |
|---|---|---|
| 5,179,380 | One-Bit Sigma-Delta Modulator with Improved Signal Stability | 01/12/93 |
| 5,339,263 | Decimator/Interpolator Filter for ADC and DAC | 08/16/94 |
| 5,361,036 | Complex Digital Demodulator Employing Chebychev-Approximation Derived Synthetic-Sinusoid Generator | 11/01/94 |
| 5,400,269 | Closed-Loop Baseband Controller for a Rebalance Loop of a Quartz Angular-Rate Sensor | 03/21/95 |
| 5,444,639 | Angular-Rate-Sensing System and Method with Digital Synthesizer and Variable-Frequency Oscillator | 08/22/95 |
| 5,444,641 | Admittance-Parameter Estimator for a Piezoelectric Resonator in an Oscillator Circuit | 08/22/95 |
| 5,459,432 | Use of a Chopper and a Sigma-Delta Modulator for Downconverting and Digitizing an Angalog Signal Including Information Modulated by a Carrier | 10/17/95 |
| 5,463,575 | Reduced Quantization Noise from a Single-Precision Multiplier | 10/31/95 |
| 5,471,396 | Estimator of Amplitude and Frequence of a Noisy Biased Sinusoid from a Short Burst of Samples | 11/28/95 |
| 5,487,015 | Self-Oscillating Driver circuit for a Quartz Resonator of an Angular-Rate Sensor | 01/23/96 |
| 5,491,725 | A Tracking Filter and Quadrature-phase-Reference Generator | 02/13/96 |
| 5,577,073 | A Frequency and Phase-Locked Two-Phase Digital Synthesizer | 11/19/96 |
| 5,576,976 | Amplitude Detection and Automatic Gain Control of a Sparesly Sampled Sinusoid by Adjustment of a Notch-Filter | 11/19/96 |
| 5,550,866 | A Demodulator/Reference Generator Based on Two Cascaded Hilbert Transformers | 07/27/96 |
| 5,566,093 | Sensor with Resonator, Digital Filter, and Display | 10/15/96 |

The disclosures of these patents and applications are incorporated herein by reference.

The present invention is suitable for very accurately measuring the current driving the DQI's tuning fork, but also may be used whenever any substantially noise-free analog signal of known frequency has been subjected to sparse sampling, and its amplitude (or, equivalently, the square of its amplitude) needs to be recovered from a small number of samples. Sparse sampling is desirable in the DQI, and in many other applications, because it allows a large number of analog signals to be monitored using a minimum of electronics. The analog signals may all be combined together in a multiplexer and the multiplexed signal applied to a single analog-to-digital converter (ADC) driving a single digital processor. The more sparsely each analog signal is sampled, the larger the number of signals which can be monitored.

Unfortunately, the more sparsely each analog signal is sampled, the longer it takes to get an accurate measurement of the signal. This is particularly true when the phase and dc bias are unknown. Such uncertainties are often introduced by the very multiplexer/ADC combination which encourages use of sparse sampling in the first place. What is needed is a method for measuring a signal which not only has been sparsely sampled, but has only a few such samples available before a measurement must be produced.

SUMMARY OF THE INVENTION

The present invention overcomes this problem by Hilbert transforming the digitized signal to an in-phase signal I and a quadrature-phase signal Q, squaring I to produce $I^2$ and squaring Q to produce $Q^2$, and summing $I^2+Q^2$ to produce $A^2$, the square of the amplitude of the input signal. The signal is sampled at about four times the signal's frequency. DC bias is eliminated by two-delay band-pass filtering the digitized signal. The dc-blocked signal is applied to a two-delay Hilbert transformer. Only five samples are required to accurately measure the amplitude. This is only two samples more than the theoretical minimum. Accuracy is limited only by the accuracies of the ADC and the processor, and by the absence of noise in the input analog signal.

DETAILED DESCRIPTION OF THE DRAWINGS

Figure 1:
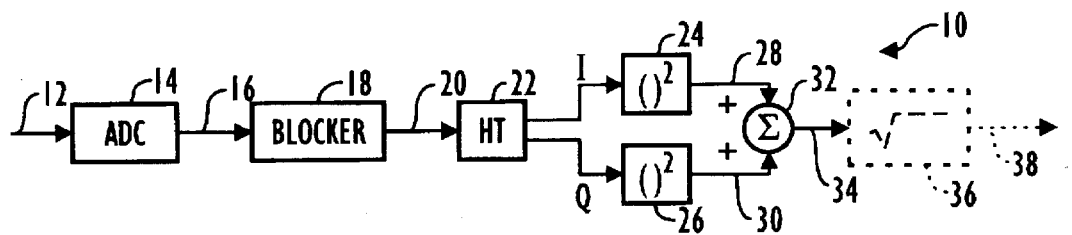
FIG. 1 is an overall schematic diagram of the present invention.

FIG. 1 is an overall schematic diagram of the present invention 10. An analog sinusoidal input signal 12 is applied to an analog-to-digital converter 14 which produces a digitized input signal 16. The digitized input signal 16 is applied to a gain-normalized dc blocker 18, the output 20 of which is applied to a Hilbert transformer 22. If desired, the dc blocker 18 may be unnormalized, as shown, with normalization taking place at any other convenient point in the signal path. The I and Q outputs of the Hilbert transformer 22 are separately squared in squaring elements 24, 26, and the squares 28, 30 are summed in a summer 32 to produce an output signal 34 representing the squared amplitude of the analog sinusoidal input signal 12. An optional square root element 36 recovers the amplitude 38 of the analog sinusoidal input signal 12.

Figure 2:
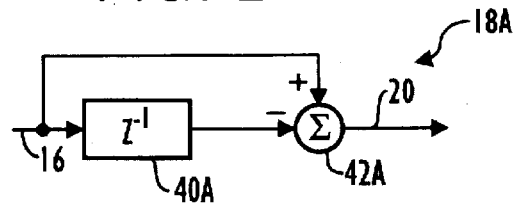
FIGS. 2, 3, and 4 are schematic diagrams of a one-delay, two-delay, and three-delay delay-subtracter dc blockers.
Figure 3:
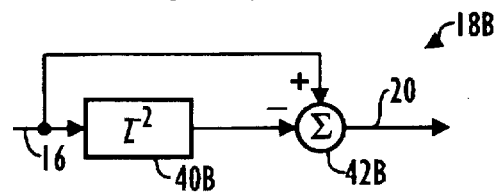
Figure 4:
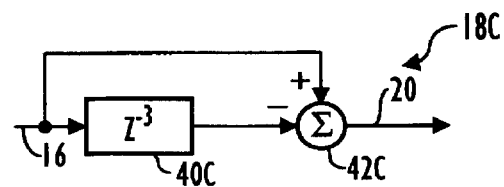

FIG. 2, 3, and 4 show the preferred dc blockers 18A, 18B, and 18C, namely, delay-subtracter dc blockers. The delay-subtracter dc blockers 18A, 18B, and 18C have one, two, and three delay elements 40A, 40B, and 40C, respectively. DC blockers having more than four delays should not be used, since they require an excessively large number of samples to generate the output signal. The output of the last delay element is applied to a subtracter 42A, 42B, or 42C which subtracts it from the digitized input signal to produce the dc blocker output 20.

Figure 5:
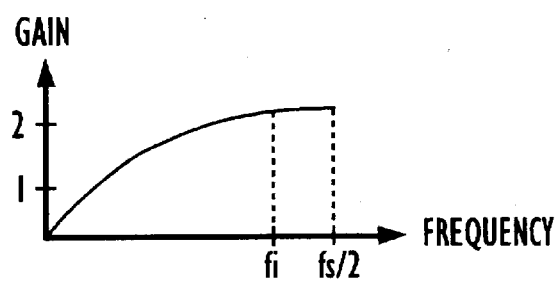
FIGS. 5, 6, and 7 are frequency response curves of the one-delay, two-delay, and three-delay delay-subtracter dc blockers shown in FIGS. 2, 3, and 4, respectively.
Figure 6:
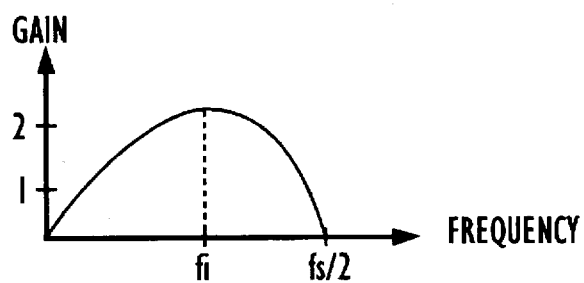
Figure 7:
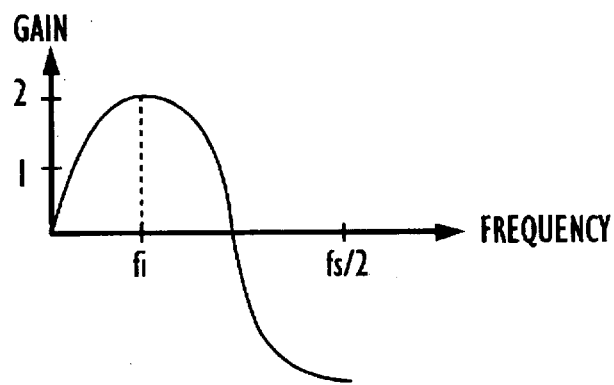

FIGS. 5, 6, and 7 show the frequency response curves for one-, two-, and three-delay dc blockers, respectively. The curves are sinusoids covering one, two, or three quadrants, respectively, and have a maximum gain of two. The actual gain will depend on where the input frequency fi actually falls. If the actual gain is not unity, it must either be allowed for or compensated for by other apparatus, forming no part of the present invention.

As is apparent from FIG. 5, a one-delay blocker (FIG. 2) should be used when the sampling frequency fs is slightly more than twice the frequency of the input signal fi (or, equivalently, when the frequency of the input signal fi is slightly less than half that of the sampling frequency fs). Similarly, a two-delay blocker (FIGS. 3, 6) should be used when the sampling frequency is about four times the frequency of the input signal, fi (or, equivalently, when the frequency of the input signal fi is about one-fourth the sampling frequency fs), and a three-delay blocker (FIGS. 4, 7) should be used when the sampling frequency fs is about six times the frequency of the input signal fi (or, equivalently, when the frequency of the input signal fi is about a sixth the sampling frequency fs). The analog-to-digital converter 14 should therefore have a sampling frequency fs of more than twice the frequency of the analog sinusoidal input signal fi (FIG. 5), but less than eight times the frequency of the analog sinusoidal input signal (FIG. 7).

Figure 8:
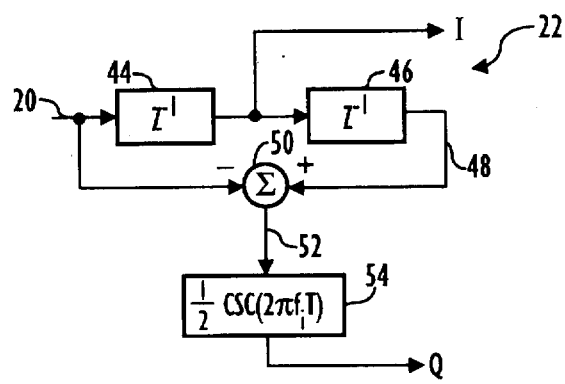
FIG. 8 is a schematic diagram of the Hilbert transformer used in the present invention.

The dc-blocked signal 20 is applied to a two-delay Hilbert transformer 22, the details of which are shown in FIG. 8. The two-delay Hilbert transformer 22 is constructed to produce an in-phase signal I and a quadrature-phase signal Q. The Hilbert transformer 22 has a first delay element 44 connected to receive the dc-blocked signal 20; it produces the in-phase signal I. The in-phase signal I is applied to a second delay element 46, which produces a doubly delayed signal 48. The dc-blocked signal 20 and the doubly delayed signal 48 are applied to a subtracter 50 which produces a difference signal 52. The difference signal 52 is applied to a multiplier 54 constructed to multiply the difference signal 52 by a constant. The output of the multiplier 54 is the quadrature-phase signal Q. The constant represents half the cosecant of the product of the sampling period T and the radian frequency of the analog sinusoidal input signal, $2\pi fi$.

Figure 9:
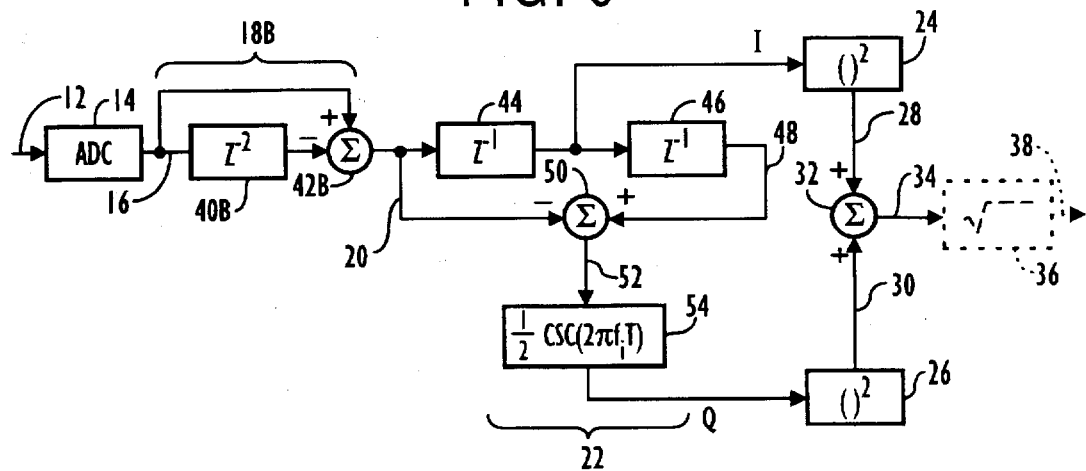
FIG. 9 is a overall schematic drawing of the preferred embodiment of the present invention.

FIG. 9 shows the preferred embodiment of the present invention. A sinusoidal analog input signal 12 of known frequency fi is sampled and digitized by an ADC 14 at about four times the frequency of the input signal fi. The digitized signal 16 is applied to a two-delay delay-subtracter dc blocker 18B, the output 20 of which is applied to a two-delay Hilbert transformer 22. Applying first, second, and third samples 16 to the dc blocker 18B allows the dc blocker 18B to produce its first output 20 to the Hilbert transformer 22. A fourth sample 16 applied to the dc blocker 18B causes a second output 20 to the Hilbert transformer 22, thus producing a first output from the first delay element 44 of the Hilbert transformer 22, that is, a first in-phase output I. A fifth sample 16 applied to the dc blocker 18B causes a third output 20 to the Hilbert transformer 22, a second in-phase output I, and a first output 48 from the second delay element 46 of the Hilbert transformer 22. This first output 48 from the second delay element 46 of the Hilbert transformer 22 is combined with the first output 20 to the Hilbert transformer 22 to provide the quadrature-phase output Q. This takes place in the subtracter 50 and multiplier 54. The in-phase I and quadrature-phase Q outputs may then be squared 24, 26 and summed 32.

Thus, only five consecutive samples 16 are required before the multiplexer can be released to monitor some other signal. This is an astonishingly low number, considering that a sinusoid of known frequency has three unknowns: amplitude, phase, and dc offset. Measuring all of these unknowns—or any of them—therefore requires the same number of consecutive samples: three.

The foregoing assumes that sampling is done at around four times the input frequency, that is, around twice the Nyquist frequency. This is desirable, since the frequency response curve is relatively flat in this operating region (see FIG. 6).

If sampling can only be done at slightly above the Nyquist frequency, then the embodiment of FIGS. 2 and 5 should be used. The reduces the required number of samples 16 even further, to four, but runs the risk that, if the input frequency fi drifts upward, it may drift to, or even above, the Nyquist frequency. This causes many difficulties, as is known in the art.

If sampling can only be done at around three times the Nyquist frequency, then the embodiment of FIGS. 4 and 7 should be used. This is not preferred, since the pass band is both narrower and not as flat. More importantly, six samples 16 are required before the amplitude can be measured. This taxes the limited capacities of the ADC 14 and processor.

Figure 10:
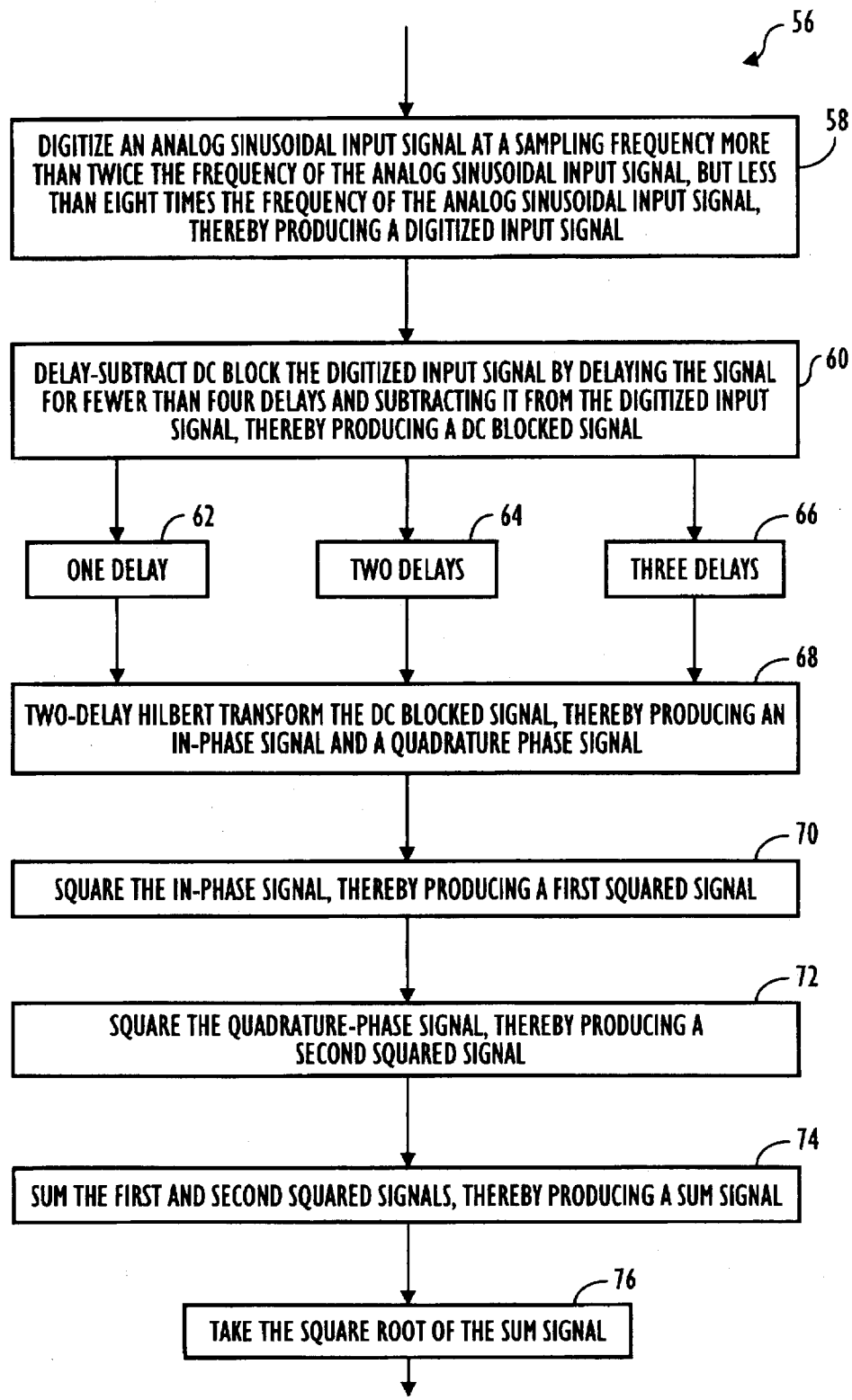
FIG. 10 is a flowchart illustrating the operation of the present invention.

FIG. 10 is a flowchart 56 illustrating the operation of the present invention. In the first step, step 58, an analog sinusoidal input signal is digitized at a sampling frequency more than twice the frequency of the analog sinusoidal input signal, but less than eight times the frequency of the analog sinusoidal input signal, thereby producing a digitized input signal. Next, step 60, the digitized input signal is delay-subtract dc-blocked by delaying the signal for fewer than four delays and subtracting it from the digitized input signal, thereby producing a dc-blocked signal. There thus may be one delay, step 62, two delays, step 64, or three delays, step 66.

Regardless of the number of delays, the dc-blocked signal is two-delay Hilbert transformed, step 68, thereby producing an in-phase signal and a quadrature-phase signal. The in-phase signal is squared, step 70, thereby producing a first squared signal. The quadrature-phase signal is also squared, step 72, thereby producing a second squared signal. The first and second squared signals are summed, step 74, thereby producing a sum signal. If desired, the square root of the sum signal may be taken, step 76.

As noted above, only five consecutive samples 16 are required before the multiplexer can be released to monitor some other signal. In some applications, it is known that there is no dc bias. In these applications, the dc-blocker 18 (or, equivalently, the dc blocking step 60) may be omitted, and only three consecutive samples will be required. This is also an astonishingly low number, considering that a dc-free sinusoid of known frequency has two unknowns: amplitude and phase. Measuring both of these unknowns—or either of them—therefore requires the same number of consecutive samples: two.

SCOPE OF THE PRESENT INVENTION

Several specific embodiments of the present invention have been disclosed herein, but the true spirit and scope of the present invention are not limited thereto. Such limitations are imposed only by the appended claims and their equivalents.

What is claimed is:

1. Apparatus for measuring the peak amplitude of an analog sinusoidal input signal, the apparatus comprising:

(a) an analog-to-digital converter having a sampling frequency more than twice the frequency of the analog sinusoidal input signal, but less than eight times the frequency of the analog sinusoidal input signal, connected to receive the analog sinusoidal input signal and constructed to produce a digitized input signal;

(b) a two-delay Hilbert transformer connected to receive the digitized input signal and constructed to produce an in-phase signal and a quadrature-phase signal;

(c) a first squaring element connected to receive the in-phase signal and constructed to produce a first squared signal;

(d) a second squaring element connected to receive the quadrature-phase signal and constructed to produce a second squared signal; and (e) a summer connected to receive the first and second squared signals and constructed to produce a sum signal.

2. The apparatus of claim 1, wherein:

(a) the apparatus further comprises a delay-subtracter dc blocker having fewer than four delays, connected to receive the digitized input signal and constructed to produce a dc-blocked signal; and (b) the two-delay Hilbert transformer is connected to receive the dc-blocked signal.

3. The apparatus of claim 1, further comprising a square root element connected to receive the sum signal and constructed to produce a square root signal.

4. The apparatus of claim 2, further comprising a square root element connected to receive the sum signal and constructed to produce a square root signal.

5. A method for measuring the peak amplitude of an analog sinusoidal input signal, the method comprising the steps of:

(a) digitizing the analog sinusoidal input signal at a sampling frequency more than twice the frequency of the analog sinusoidal input signal, but less than eight times the frequency of the analog sinusoidal input signal, thereby producing a digitized input signal;

(b) two-delay Hilbert transforming the dc-blocked signal, thereby producing an in-phase signal and a quadrature-phase signal;

(c) squaring the in-phase signal, thereby producing a first squared signal;

(d) squaring the second the quadrature-phase signal, thereby producing a second squared signal; and (e) summing the first and second squared signals, thereby producing a sum signal.

6. The method of claim 5, wherein:

(a) the method further comprises the step of delay-subtract dc blocking the digitized input signal by delaying the signal for fewer than four delays and subtracting it from the digitized input signal, thereby producing a dc-blocked signal; and (b) the two-delay Hilbert transforming step transforms the dc-blocked signal.

7. The method of claim 6, further comprising the step of taking the square root of the sum signal, thereby producing a square root signal.

8. The method of claim 5, further comprising the step of taking the square root of the sum signal, thereby producing a square root signal.

* * * * *